United States Patent [19]
Prokopp

[11] Patent Number: 5,639,254
[45] Date of Patent: Jun. 17, 1997

[54] APPARATUS FOR TESTING A PLUG

[75] Inventor: Mandred Prokopp, Wertheim, Germany

[73] Assignee: TSK Prüfsysteme für elektrische Komponenten GmbH, Porta Westfalica, Germany

[21] Appl. No.: 424,661

[22] Filed: Apr. 19, 1995

Related U.S. Application Data

[63] Continuation of Ser. No. 8,215, Jan. 25, 1993, abandoned.

[30] Foreign Application Priority Data

Feb. 13, 1992 [DE] Germany .................. 42 04 283.6

[51] Int. Cl.$^6$ .................................................. H01R 4/50
[52] U.S. Cl. ............................. 439/345; 439/359
[58] Field of Search ........................... 439/345, 347, 439/372, 350, 357, 358, 359, 132; 70/58, 57, 30, 275; 292/144

[56] References Cited

U.S. PATENT DOCUMENTS

| | | | |
|---|---|---|---|
| 3,067,402 | 12/1962 | Thaw | 439/359 |
| 4,367,003 | 1/1983 | Frantz | 439/347 |
| 4,579,376 | 4/1986 | Charlton | 292/144 |
| 4,799,719 | 1/1989 | Wood | 292/144 |
| 4,834,663 | 5/1989 | Kahl | 439/132 |

*Primary Examiner*—Hien Vu
*Attorney, Agent, or Firm*—Henry M. Feiereisen

[57] ABSTRACT

Apparatus for testing a cable plug for misfits, faulty connections or the like, includes a receptacle with a plug-receiving socket of a contour corresponding to the outer configuration of a plug being tested. A locking device for securely retaining the plug within the plug-receiving socket is detachably mounted to the receptacle at a selected position thereof by a suitable fastening assembly.

8 Claims, 1 Drawing Sheet

APPARATUS FOR TESTING A PLUG

This is a continuation of application Ser No. 08/008,215 filed Jan. 25, 1993, now abandoned.

BACKGROUND OF THE INVENTION

The present invention refers to an apparatus for testing a cable plug for misfits and/or faulty contacts, and in particular to a testing apparatus of the type having a receptacle with a plug-receiving recess or socket of a contour corresponding to the outer configuration of the plug being tested, and a locking device for securely retaining the plug after being inserted in the plug-receiving socket.

A testing apparatus of this type is known e.g. from U.S. Pat. No. 4,834,663 which discloses a locking device including a holding pin positionable by a pneumatically actuated piston laterally of the plug and movable transversely thereof to secure the plug in position. In general, the plug receiving socket of the receptacle has a profile which complements the outer contour of the plug so that each available plug type requires separate and complete testing apparatus.

A fully operative testing apparatus is equipped with a locking device which may be electrically, mechanically or pneumatically actuated and ensures a secure fixation of the plug in the receptacle during the testing process. This locking device which is an integral part of the receptacle is of relatively complicated structure, especially when being operated electrically or pneumatically.

Since a number of testing apparatuses are required to accommodate the many available plugs and since each testing apparatus is equipped with its own locking device, the overall testing process becomes relatively complicated and expensive, especially since only a fraction of testing apparatuses is utilized at one time while others are kept idle.

SUMMARY OF THE INVENTION

It is an object of the present invention to provide an improved apparatus for testing a cable plug obviating the afore-stated drawbacks.

In particular, it is an object of the present invention to provide an improved testing apparatus for testing a cable plug by which the testing process can be run at greater overall cost-efficiency, even when some testing apparatuses are idle.

These objects and others which will become apparent hereinafter are attained in accordance with the present invention by detachably securing the locking device to the receptacle via suitable fastening means.

By eliminating the permanent, fixed connection between the testing apparatus and the locking device and allowing a locking device to be detachably secured to each testing apparatus, the number of required locking devices can be limited to the number of locking devices actually in use. This not only simplifies the making of a testing apparatus but the number of locking devices being required can be significantly reduced compared to prior art constructions so as to render the testing process significantly more cost-efficient.

A further advantage of the present invention is the simplification by which defective locking devices can be replaced. To date, a removal of a defective locking device from a respective testing apparatus was complicated and time consuming. Now, in accordance with the present invention, the locking device can easily be removed from the receptacle or can be replaced even before being attached to the receptacle when a defect is detected in time.

According to a further feature of the present invention, the locking device includes a housing which is provided with an oblong hole of generally T-shaped cross section. Screwed with their ends into the receptacle are screw fasteners which engage in the oblong hole of the housing when the locking device is inserted in the receptacle, whereby the head of each screw fastener bears upon a contact surface of the housing of the locking device. The provision of the oblong hole allows a selective positioning of the locking device relative to the receptacle to compensate for depth variations between individual plug-receiving recesses of the receptacle. Advantageously, the screw fasteners and the oblong hole should be standardized to allow each locking device to be detachably secured to each receptacle.

BRIEF DESCRIPTION OF THE DRAWING

The above and other objects, features and advantages of the present invention will now be described in more detail with reference to the accompanying drawing, in which.

DETAILED DESCRIPTION OF PREFERRED EMBODIMENTS

Figure 1:
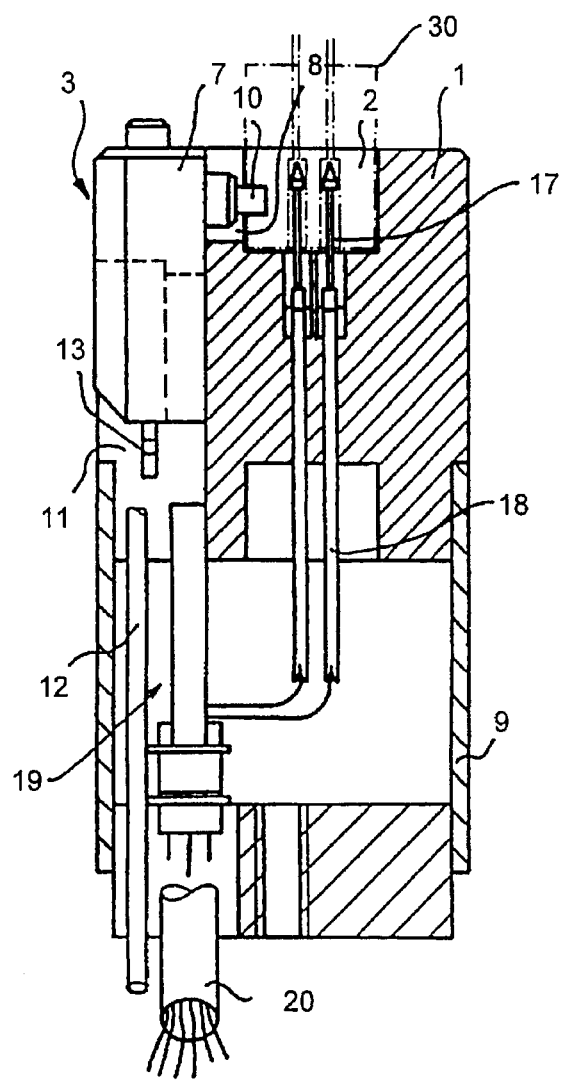
FIG. 1 is a sectional side view of one embodiment of a testing apparatus in accordance with the present invention.
Figure 3:
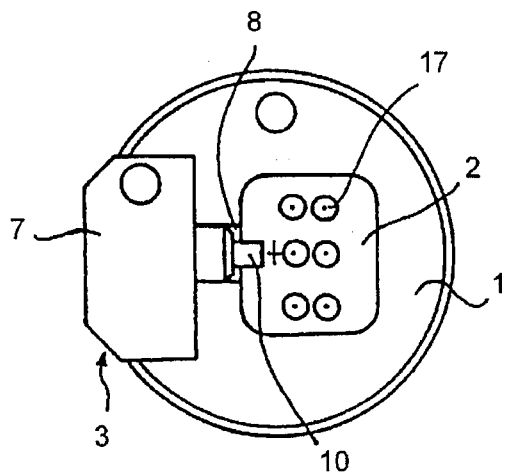
FIG. 3 is a top view of the testing apparatus according to FIG. 1.

Referring now to the drawing, and in particular to FIG. 1, there is shown a sectional side view of one embodiment of an apparatus for testing a cable plug 30, shown in broken lines, for misfits and/or faulty contacts, including a receptacle 1 which is of essentially cylindrical configuration (see FIG. 3) and includes a circumferential axial recess 16 for attachment to a stationary mounting 9. The upper end of the receptacle 1 is provided with a plug-receiving recess or socket 2 for receiving a not shown plug, with the contour of the socket 2 corresponding to the outer configuration of the plug. A plurality of test terminals or pins 17, e.g. six test pins 17 as shown in FIG. 3, project through the base of the socket 2 and are secured in respective sleeves 18 which traverse the receptacle 1. The test pins 17 are electrically connected e.g. via a suitable electric plug-in connection, generally designated by reference numeral 19, and outwardly extended by a cable 20.

Figure 2:
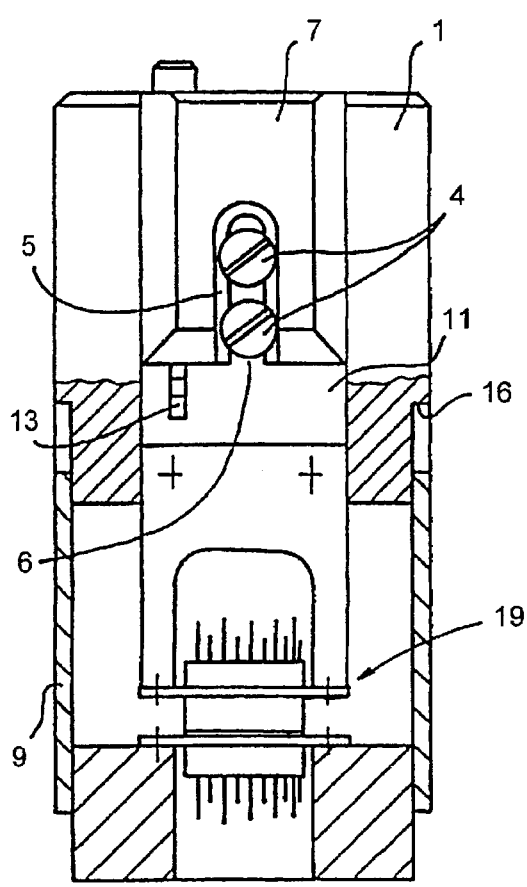
FIG. 2 is a fragmentary sectional frontal view of the testing apparatus of FIG. 1.

As shown in FIG. 1 and in FIG. 2, which is a partially sectional frontal view of the testing apparatus, the receptacle 1 is provided with a central recessed axial guiding groove 11 for receiving the housing 7 of a locking device, generally designated by reference numeral 3. Suitably, the width of the groove 11 approximately corresponds to the width of the housing 7. The locking device 3 is detachably secured to the receptacle 1 within the groove 11 by a pair of screw fasteners 4 which extend near the bottom of the groove 11 and threadably engage with their ends respective bores of the receptacle 1. At its lower end, the housing 7 of the locking device 3 is provided with an oblong hole 6 which is of generally T-shaped cross section and downwardly open to allow the shank of the screw fasteners 4 to enter the oblong hole 6 when the locking device 3 with its housing 7 is downwardly pushed along the groove 11. Upon tightening the screw fasteners 4, their head is pressed against a contact surface 5 of the housing 7, bounding the oblong hole 6. In order to compensate variations in depth between the sockets 2 of receptacles 1, the housing 7 is adjustable in axial direction relative to the screw fasteners 4 along the oblong hole 6. In this manner, the locking device 3 is selectively positionable relative to the plug-receiving socket 2.

Near its top, the locking device 3 is provided with a pneumatically actuated holding pin 10 which projects through a bore 8 of the receptacle 1 into the socket 2 and is movable in a direction transverse to the lead-in direction of a plug. The holding pin 10 is part of a not shown cylinder/piston assembly which is incorporated in the housing 7. Air for actuation of the holding pin 10 is supplied via a hose 12 which is suitably connected to a not shown air supply source. The air hose 12 attaches to a nipple or tube 13 which downwardly projects from the underside of the housing 7. Upon insertion of a plug into the socket 2 of the receptacle 1, the holding pin 10 is retracted and then pressed against a side wall of the plug to secure the latter in position.

In order to remove the locking device 3 from the receptacle 1, the screw fasteners 4 need only be loosened and the air hose 12 be pulled off the nipple 13 for allowing withdrawal of the housing 7 from the receptacle 1.

Persons skilled in the art will understand that the connection between the nipple 13 and the air hose 12 is shown by way of example only, and may be substituted by any other suitable means without departing from the scope of the present invention. For example, the air supply connection may also be attained by a conventional pneumatic quick acting locking mechanism to connect the air supply line with the air inlet conduit of the housing 7. It will also be appreciated by persons skilled in the art that the detachable securement of the locking device 3 to the receptacle 1 via screw fasteners 4 and oblong hole 6 is shown by way of example only, and may be substituted by other suitable means without departing from the spirit of the present invention.

Figure 4:
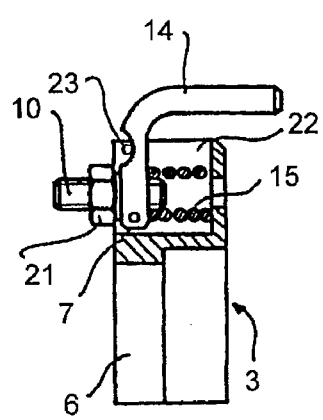
FIG. 4 is a partially sectional side view of a modified locking device operatively connected to a testing apparatus according to the present invention.

Turning now to FIG. 4, there is shown a detailed, partly sectional side view of a different type of locking device 3, with the holding pin 10 being manually actuated for occupying a locking position and a release position. The holding pin 10 is secured to the housing 7 by a nut 21 and projects into a bore 22 of the housing 7. Mounted inside the bore 22 to the holding pin 10 is an elbow shaped handle 14 which extends outwardly and bears upon an abutment 23. The handle 14 is loaded by a spring 15 which extends within the bore 22 between the handle 14 and an inside wall surface of the housing 7. By lifting the handle 14 about the abutment 23 against the force exerted by the spring 15, the holding pin 10 is withdrawn to allow insertion of a plug to be tested. Upon release of the handle 14, the force of the spring 15 returns the holding pin 10 into its locking position in which the holding pin 10 is pressed against a side wall surface of the plug to secure the latter.

Generally, the locking and release of the holding pin 10 and thus of a plug being tested may also be carried out through a mechanic as conventionally known by the term "Securit-Mechanik" or "ball-and-nut type mechanic" as utilized e.g. in ball point pens.

It will be understood by persons skilled in the art that the attachment of the receptacle 1 in the mounting 9 is shown by way of example only, and may be substituted also by other suitable means without departing from the spirit of the present invention. For example, it may be possible to provide the receptacle 1 with a fixture which is directly attached to a support plate. In many cases, the use of such a fixture is sufficient and can be made especially inexpensive.

While the invention has been illustrated and described as embodied in an apparatus for testing a plug, it is not intended to be limited to the details shown since various modifications and structural changes may be made without departing in any way from the spirit of the present invention.

What is claimed as new and desired to be protected by Letters Patent is set forth in the appended claims:

1. Apparatus for testing a cable plug for misfits or faulty connections; comprising:
   a receptacle having a plug-receiving socket of a contour corresponding to an outer configuration of a cable plug being tested, said receptacle having an attachment area;
   a plurality of testing terminal pins in said receptacle for contacting and testing the cable plug;
   a locking device arranged laterally to said plug-receiving socket in said attachment area for securely retaining the cable plug within said socket;
   fastening means for detachably mounting said locking device to said receptacle; and
   wherein said locking device has a housing provided with an oblong hole, said fastening means including a screw fastener secured in said receptacle and engageable in said oblong hole to allow selected positioning of said locking device relative to said receptacle.

2. Apparatus as defined in claim 1 wherein, said screw fastener has a head bearing upon a contact surface of said housing bounding said oblong hole.

3. Apparatus as defined in claim 1 wherein said receptacle is provided with an axial groove for receiving said housing of said locking device.

4. Apparatus as defined in claim 3 wherein said groove has a width approximately corresponding to the width of said housing.

5. Apparatus as defined in claim 1, and further comprising a stationary mounting, said receptacle being secured to said mounting.

6. Apparatus as defined in claim 1 wherein said locking device is a mechanically actuated locking device.

7. Apparatus as defined in claim 1 wherein said locking device is a pneumatically actuated locking device.

8. Apparatus as defined in claim 1 wherein said locking device includes a spring-loaded holding pin projecting into said plug-receiving socket and actuatable manually from the outside for movement between a locking position and release position of the plug being tested.

* * * * *